United States Patent
Woolery et al.

(10) Patent No.: US 6,531,745 B1
(45) Date of Patent: Mar. 11, 2003

(54) ELECTRO STATIC DISCHARGE PROTECTION N-WELL BALLAST RESISTOR DEVICE

(75) Inventors: Bruce Woolery, Sherwood, OR (US); Alper Ilkbahar, Santa Cruz, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/475,728

(22) Filed: Dec. 30, 1999

(51) Int. Cl.[7] .......................... H01L 23/62; H01L 29/76
(52) U.S. Cl. .................... 257/363; 257/403; 257/541; 257/359
(58) Field of Search ................... 257/528, 529, 257/543, 530, 531, 532, 541, 536–540, 544, 406, 407, 410, 539, 363, 358–359, 402–404; 438/171, 210, 382

(56) References Cited

U.S. PATENT DOCUMENTS

| | | | | |
|---|---|---|---|---|
| 3,577,019 A | * | 5/1971 | Storm | 327/541 |
| 4,406,997 A | * | 9/1983 | Depp et al. | 257/538 |
| 5,019,888 A | | 5/1991 | Scott et al. | |
| 5,637,902 A | * | 6/1997 | Jiang | |
| 5,705,417 A | * | 1/1998 | Tseng | 438/305 |
| 5,952,701 A | * | 9/1999 | Bulucea et al. | 257/407 |
| 6,034,388 A | * | 3/2000 | Brown et al. | 257/296 |

OTHER PUBLICATIONS

Turner, "Channel bootstrapping for a FET resistor", Feb. 18, 1986, New Electronics, vol. 19, No. 4, p. 22.*

* cited by examiner

*Primary Examiner*—Olik Chaudhuri
*Assistant Examiner*—Dilinh Nguyen
(74) *Attorney, Agent, or Firm*—Peter Lam

(57) ABSTRACT

An n-well resistor device and its method of fabrication. The n-well resistor device of the present invention comprises a first n-type region and a second n-type region formed in an n-type silicon region. A gate dielectric layer formed on said n-type silicon region. A polysilicon gate formed on said gate dielectric.

19 Claims, 8 Drawing Sheets

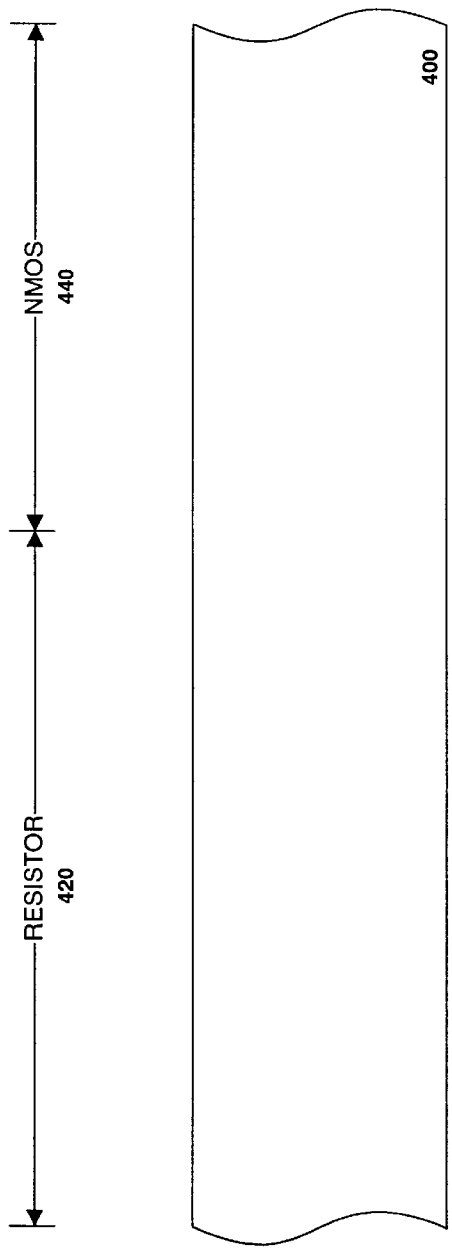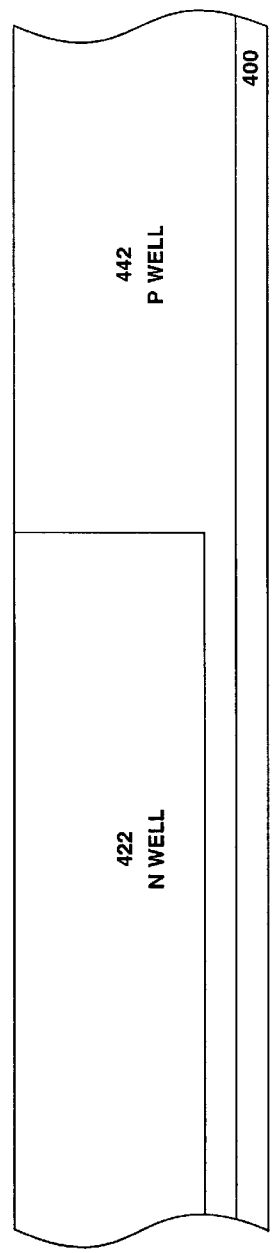
FIG. 4A
FIG. 4B

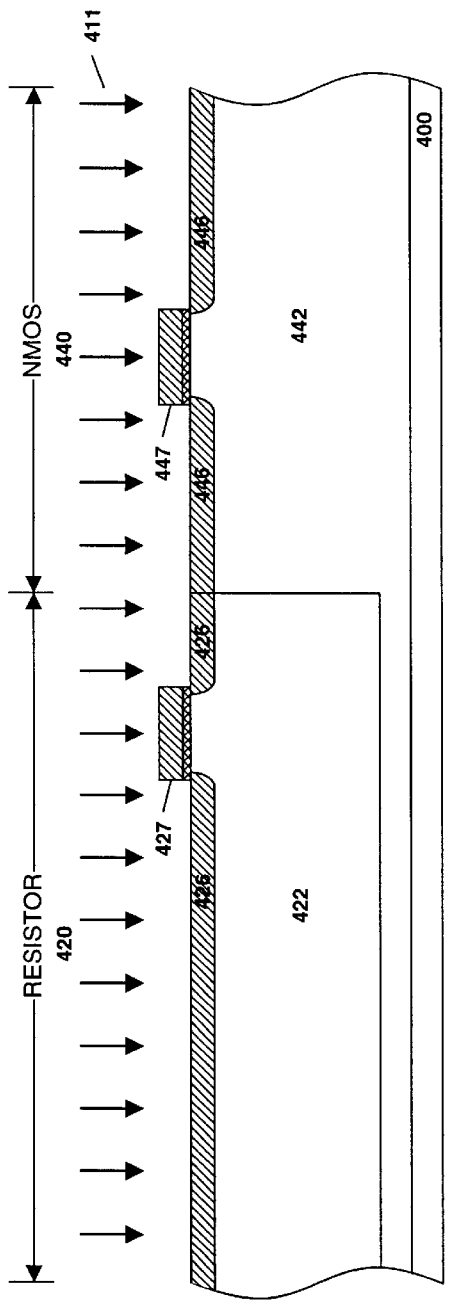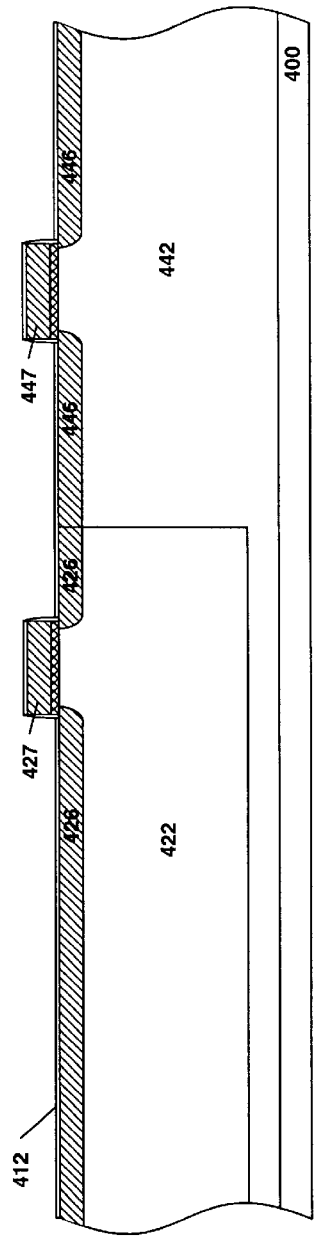
FIG. 4E
FIG. 4F

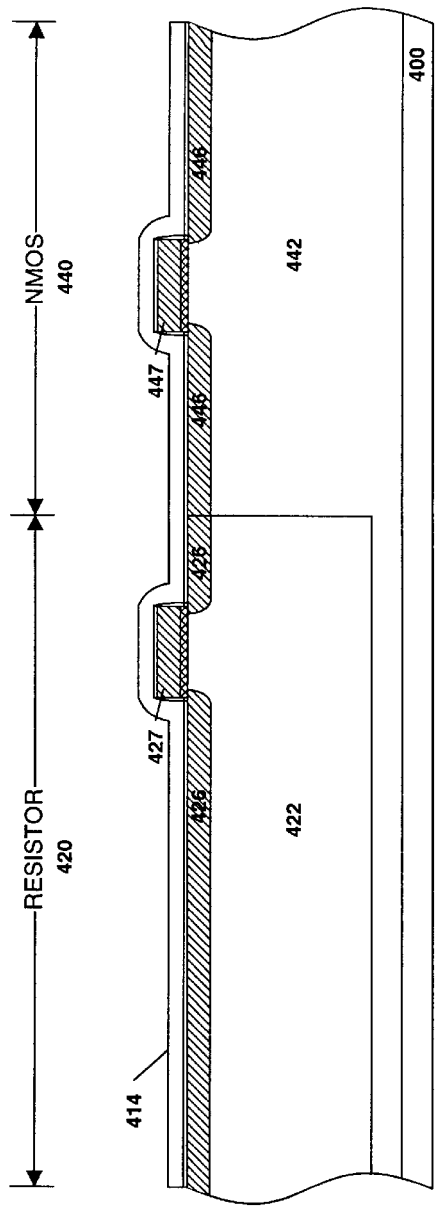
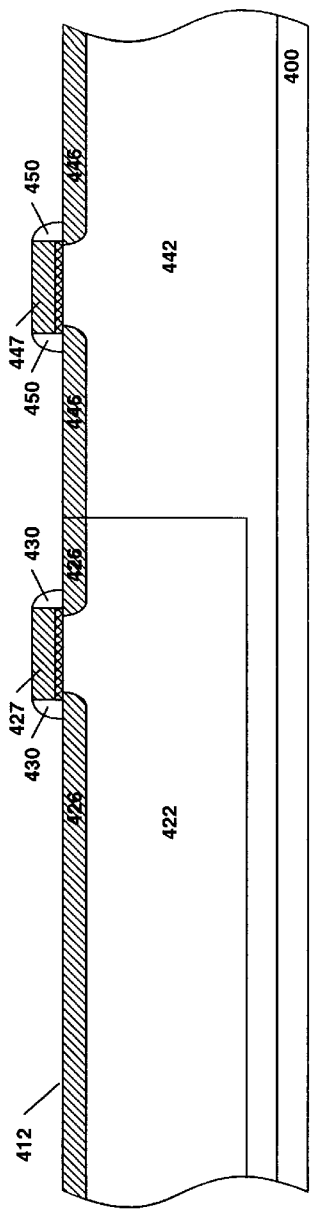
FIG. 4G
FIG. 4H

ELECTRO STATIC DISCHARGE PROTECTION N-WELL BALLAST RESISTOR DEVICE

FIELD OF THE INVENTION

The present invention relates generally to the field of semiconductor manufacturing, and more specifically to a n-well resistor and its method of fabrication.

BACKGROUND OF THE INVENTION

One important aspect of product development in the semiconductor industry relates to the quality and reliability of integrated circuit devices. It is well known that the accumulation of static charge can lead to extremely high voltages developed near an integrated circuit (IC). Electrostatic discharge (ESD) refers to the phenomenon of the electrical discharge of high current for short duration. This current could be the result of the static charge build up on a particular IC package or on a nearby human being handling that particular IC package. ESD is a serious problem for semiconductor devices since it has the potential to destroy an entire integrated circuit. Because ESD events often occur across the circuits attached to the package nodes, circuit designers have concentrated their efforts on developing adequate protection mechanisms for these sensitive circuits. Ideally, an ESD device should be able to protect an IC against any conceivable static discharge by passing large currents in a short time in a non-destructive manner.

N-well resistors are used as part of the electrostatic discharge (ESD) scheme in complementary metal oxide semiconductor (CMOS) integrated circuits. Presently in the current state of the art, the solution uses a high resistance n-well ballast resistor formed under isolation in pinched n-well.

A conventional n-well resistor constructed with an isolation structure is shown in FIGS. 1A and 1B. FIG. 1A is an illustration of an overhead view of a conventional n-well resistor device 101 formed with a shallow trench isolation (STI) structure 108 together with an n-type metal oxide semiconductor (NMOS) transistor device 113. FIG. 1B is an illustration of a cross-sectional view of the conventional n-well resistor device 101 and NMOS transistor 113 of FIG. 1A along elevation A. Resistor 101 includes a first n+ polysilicon region 104 and a second n+ polysilicon region 110 formed on an n-type silicon region 106. These two n+ diffusion regions 104, 110 are the two ends of the resistor 101. An isolation structure, a shallow trench isolation (STI) structure 108 here, is used to form the n-well resistor 101 by blocking salicide formation between the first 104 and second 110 poly regions. Silicide is formed when metal reacts with silicon. The STI structure of this n-well resistor controls the diffusion and isolates the two terminals 103, 109 of the resistor 101. Hence, silicide does not form on the STI 108. N+ silicide 103, 109 is formed on top of the poly regions 104, 110. The STI 108 is formed inside the n-well 106 and consumes a portion of the n-well. This arrangement is known as a pinched well and results in higher sheet resistance of the overall resistor structure.

An NMOS transistor 113 is shown with this resistor 101. N-type transistor 113 comprises an n+ polysilicon gate 112 formed on a dielectric with is form on a p-type silicon region 120. A pair of n+ source/drain regions 118, 111 are formed along laterally opposite sidewalls of polysilicon gate 112. N-type tip regions extend out from the source/drain regions 118, 111 and underneath the polysilicon gate 112. Transistor 113 also includes a pair of spacers formed along laterally opposite sidewalls of the polysilicon/dielectric stack. Also formed on the source/drain regions 118, 111, and the poly gate 112 is silicide 115, 117, 119.

The n-well resistor device 101 is coupled to the NMOS transistor 113. The two polycide regions 103, 109 serve as the two terminals of the resistor 101. One end 109 of the resistor 101 is coupled to the drain 115 of the NMOS device 113 here.

During an electrostatic discharge (ESD) event, a phenomenon known as snap-back occurs with the NMOS device. A high current can flow through the device during the event an cause a catastrophic failure. The resistor 101 serves to limit the amount of current conducted and to distribute current across the channel. The conventional n-well resistor 101 described above causes current to flow from the drain terminal 115 of the NMOS device 113 to one end 109 of the resistor 101 and over to the other end 103. But the current path in this resistor 101 comprises an X component (horizontal) and a Y component (vertical). A pinched area is created in the n-well 106 under the STI 108. The STI structure 108 prevents current from flowing in a straight path from the diffusion at one end 109 of the resistor 101 to the diffusion at the other end 103. The current has to go around the STI structure 108 by traveling down in the n-well 106, under the STI 108, and back up through the n-well 106.

While these pinched n-well resistors fulfill the needs of previous technologies, newer semiconductor processing techniques have introduced another issue. The smaller device dimensions of for new semiconductor technologies have significant current causes a reduction in the horizontal dimension of the current path through the n-well resistor. Meanwhile, the vertical component of the current path becomes more dominant. However, the horizontal component of a resistor is more important because that dimension can be controlled. Generally, the longer the resistor, the greater the resistance.

But in new process technologies, the horizontal component of the current path got smaller while the vertical component was not affected. Even though the depth or vertical component did not adversely affect the operation of the resistor, designer do not have good control over the depth. As the new process technologies reduced device dimensions, transistors got smaller, but resistors did not. In order to compensate for the reduced resistance, larger resistor devices had to be constructed to compensate.

The semiconductor process technology had another effect on resistor. The amount of resistance available from a resistor could vary on the order of 50% from one process technology to another. Designers should have better control of circuit impedance without such large variations.

SUMMARY OF THE INVENTION

An n-well resistor device and its method of fabrication is described. The n-well resistor device of the present invention comprises a first n-type region and a second n-type region formed in an n-type silicon region. A gate dielectric layer formed on said n-type silicon region. A polysilicon gate formed on said gate dielectric.

Other features and advantages of the present invention will be apparent from the accompanying drawings and from the detailed description that follow below.

BRIEF DESCRIPTION OF THE DRAWINGS

The present invention is illustrated by way of example and not limitations in the figures of the accompanying drawings, in which like references indicate similar elements, and in which:

FIG. 4A is an illustration of a cross-sectional view of a substrate;

FIG. 4B is an illustration of a cross-sectional view showing the formation of n-well regions and p-well regions in the substrate of FIG. 4A;

FIG. 4E is an illustration of a cross-sectional view showing the doping of the polysilicon layer and the formation of n-type tip implants in the n-well resistor and NMOS portions of the substrate of FIG. 4D;

FIG. 4F is an illustration of a cross-sectional view showing the formation of a thermal oxide and a high temperature oxide over the substrate of FIG. 4E;

FIG. 4G is an illustration of a cross-sectional view showing the formation of a silicon nitride layer over the substrate of FIG. 4F;

FIG. 4H is an illustration of a cross-sectional view showing the formation of spacers from the silicon nitride layer the substrate of FIG. 4G;

DETAILED DESCRIPTION

The present invention is a novel n-well resistor device and its method of fabrication. In the following description, numerous specific details are set forth in order to provide a thorough understanding of the present invention. One of ordinary skill in the art, however, will appreciate that these specific details are not necessary in order to practice the present invention. In other instances, well known semiconductor fabrication processes and techniques have not been set forth in particular detail in order to not necessarily obscure the present invention.

Figures 1A, 1B:
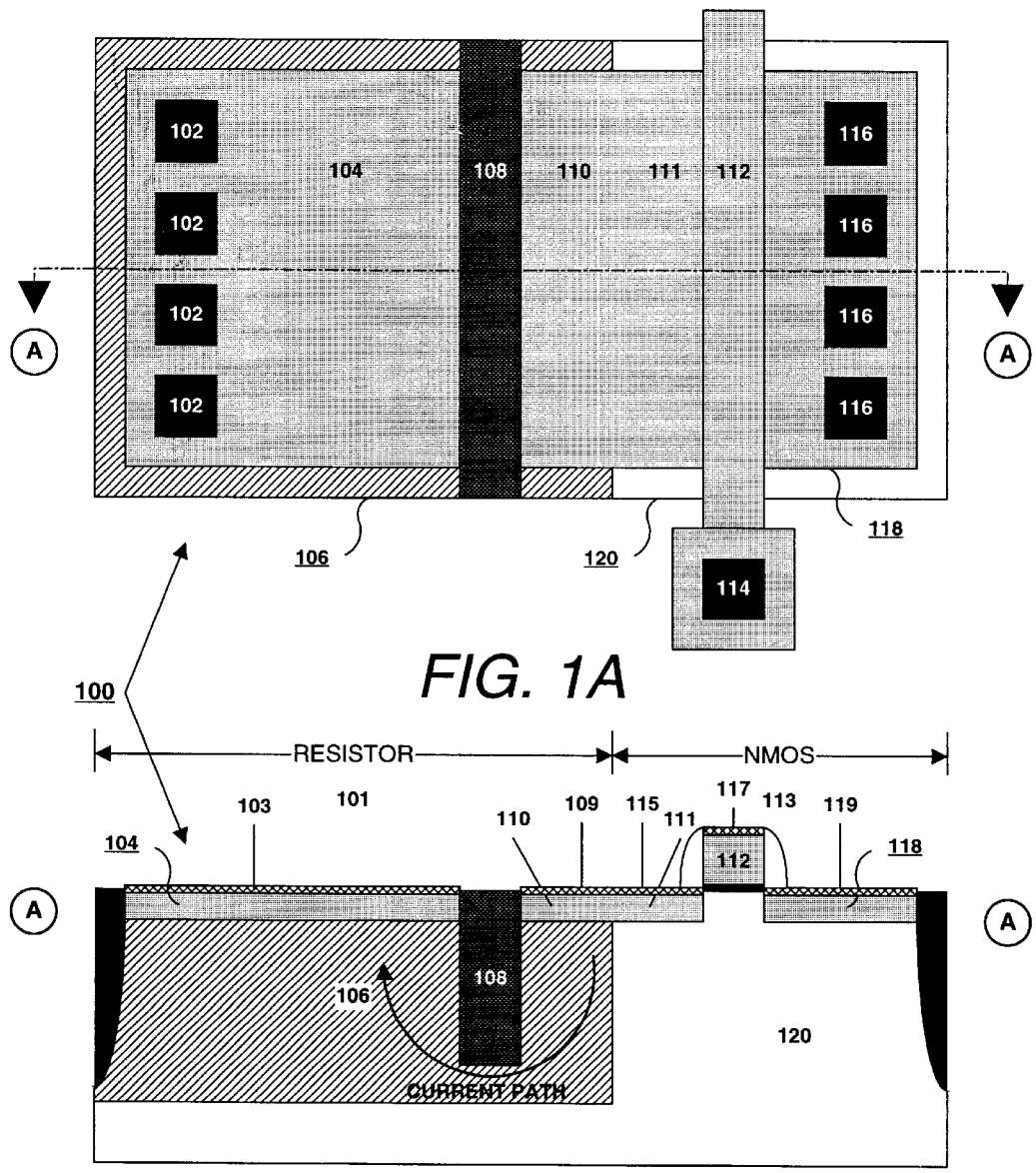
FIG. 1A is an illustration of an overhead view of a conventional n-well resistor device using a shallow trench isolation (STI) structure.
FIG. 1B is an illustration of a cross-sectional view of the conventional n-well resistor device of FIG. 1A.
Figure 2:
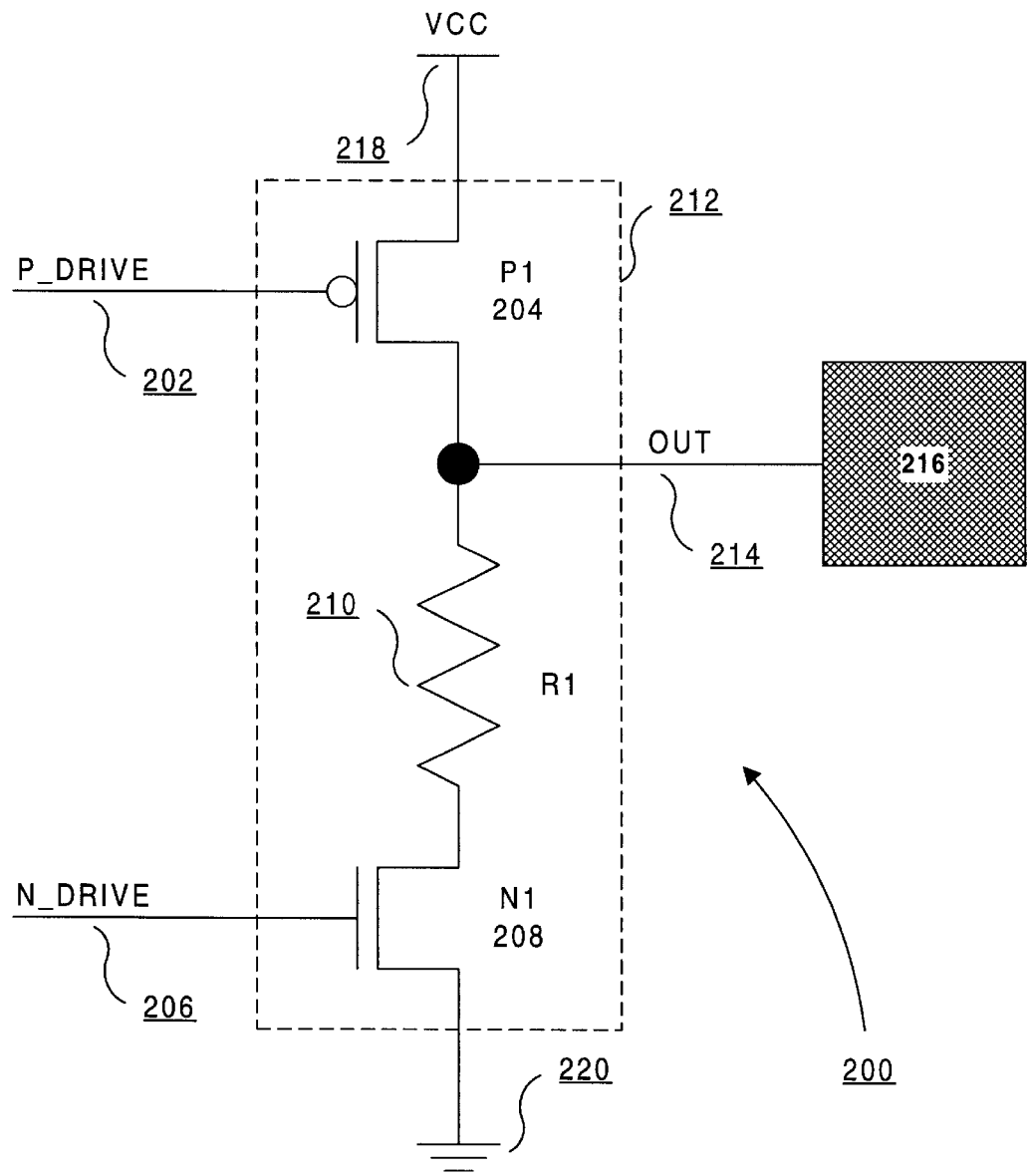
FIG. 2 is an illustration of a schematic of an output buffer circuit including an electrostatic discharge (ESD) resistor device coupled to an output pad in accordance with one embodiment of the present invention.

FIG. 2 is an illustration of a schematic of an output buffer circuit 212 including an ESD resistor device 210 coupled to an output pad 216 in accordance with one embodiment of the present invention. The buffer circuit 212 of this example is similar to a simple inverter like buffer. The output buffer circuit 212 comprises of an n-type transistor device, a resistor device, and a p-type transistor device. The circuit 200 of FIG. 2 can be fabricated with a CMOS technology. The p-type field effect transistor device P1 204 has its source terminal connected to a VCC supply 218 and its gate terminal connected to a control signal, P_DRIVE 202. The drain terminal of P1 204 is connected to output pad 216 at node OUT 214. Also connected to the output pad 216 at OUT 214 is a first terminal of resistor R1 210. The second terminal of R1 210 is connected to the drain terminal of n-type field effect transistor N1 208. The gate terminal of N1 208 is connected to a control signal N_DRIVE 206 and the source terminal of N1 208 is connected to a ground potential 220. For this output buffer 212, P1 204 serves as a pull-up device and N1 208 is a pull-down device.

The resistor R1 210 in this output buffer circuit 212 is an ESD n-well ballast resistor device in accordance with the present invention. R1 210 is part of an ESD scheme integrated into the output buffer 212. In the present circuit 200, the resistor R1 protects the NMOS transistor device 208 from a phenomenon called snap-back.

For one embodiment of an output buffer, P_DRIVE 202 and N_DRIVE 206 are connected together to a common control signal. The control signal controls what kind of value the output buffer 212 drives to the output pad 216. For another embodiment of an output buffer 212, P_DRIVE 202 and N_DRIVE 206 can be connected to different control signals.

The output buffer 212 of this example is part of a larger input/output (I/O) buffer circuit. The entire I/O buffer circuit can be designed such that it has inherent ESD protection. For this example, the n-well resistor device of the present invention can be part of this ESD scheme. Other ESD devices may not be as explicit as an n-well resistor, but are devised by proper layout techniques using parasitic devices such as properly aligning p-type and n-type diffusions or guard rings, which are typically not reflected in schematics.

Figure 3A:
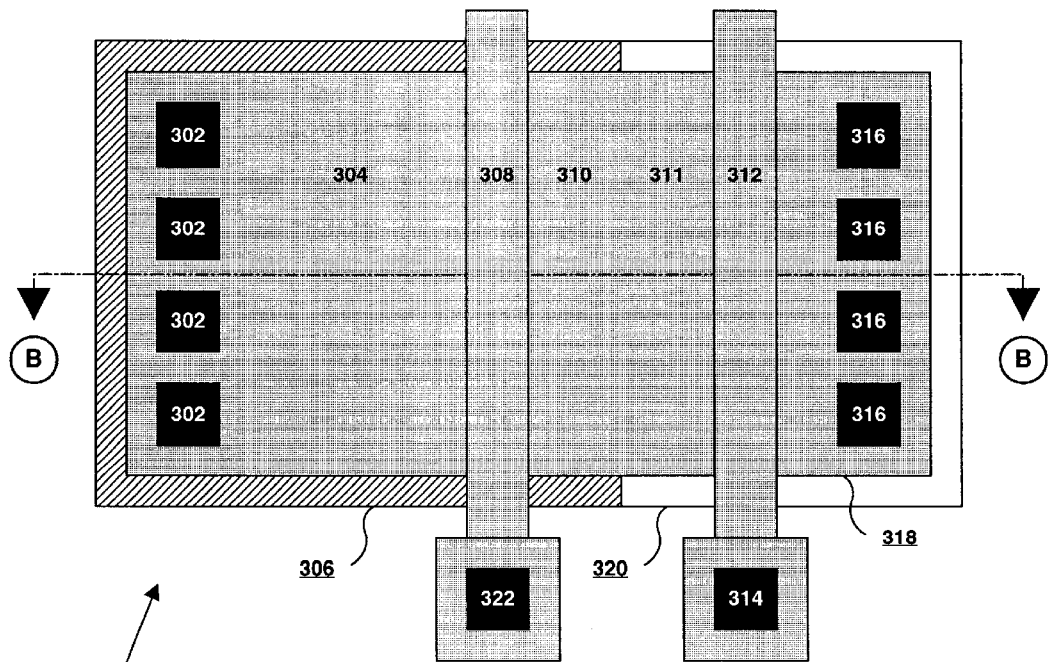
FIG. 3A is an illustration of an overhead view of an n-well resistor device in accordance with the present invention.
Figure 3B:
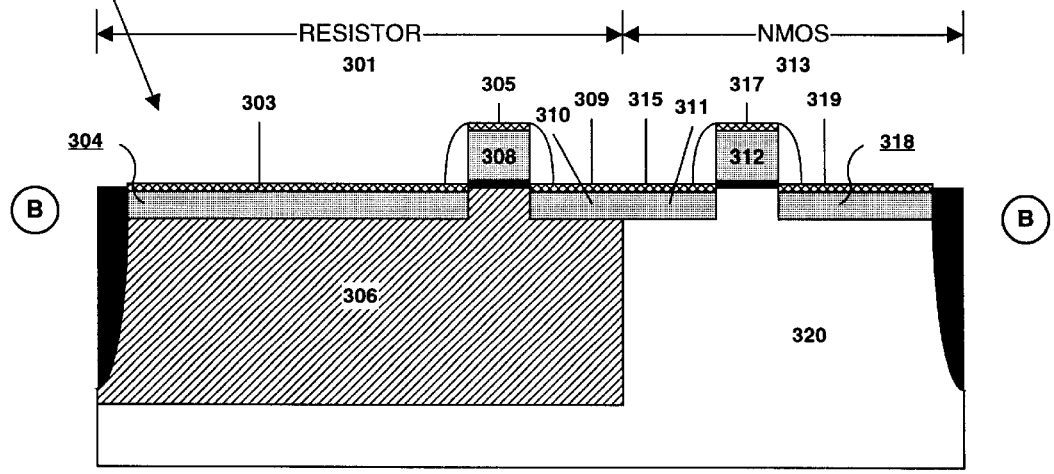
FIG. 3B is an illustration of a cross-sectional view of the n-well resistor device of FIG. 3B.

An example of an n-well resistor 300 in accordance with the present invention is shown in FIGS. 3A and 3B. FIG. 3A is an illustration of an overhead view of an n-well resistor 301 device together with an NMOS transistor device 313 for one embodiment of the present invention. FIG. 3B is an illustration of a cross-sectional view of the n-well resistor device 301 and NMOS transistor device 313 of FIG. 3A along elevation B. The n-well resistor 301 comprises a structure similar to a transistor. Resistor 301 is formed on an n-type silicon region 306 of a single crystalline silicon substrate. The n-type silicon region 306 of this embodiment is an n-well. A gate dielectric is formed on this n-type region 306. A control gate 308 is formed on the gate dielectric layer. The control gate 308 for one embodiment of the present invention is a polycide film (i.e. a film comprising a polysilicon/silicide stack) comprising a lower polysilicon film and an upper silicide film 305 such as, but not limited to, titanium silicide or tungsten silicide.

An n+ type drain region 304 and n+ type source region 310 are formed along laterally opposite sidewalls of control gate 308. The drain 304 and source 310 regions are heavily doped n-type silicon regions having a doping density of at least $1 \times 10^{19}$ atoms/cm$^3$ and can have silicide 309, 303 formed thereon. Additionally shallow n-type tip implants can be located adjacent to source/drain regions 310, 304 and extend out from the source/drain regions to beneath the control gate 308. The portion of the n-type region between the tip implants of the source and drain regions 310, 304 beneath the control gate 308 defines the channel region of the n-well resistor device 301. For the n-well resistor device 301 of this embodiment, the drain 304, 303 is a first terminal of the resistor and the source 310, 309 is a second terminal of the device.

Resistor device 301 can also includes a pair of spacers formed along laterally opposite sidewalls of the control gate/dielectric stack. The spacers can include a bulk silicon nitride portion and a buffer oxide layer. Spacers seal and prevent contamination the gate dielectric and can be used to assist the formation of silicide layers 303, 305, 309, 315, 317, 319 in a self-aligned silicide process.

The silicide of this embodiment is formed with a self-aligned process. These self-aligned silicides, also known as salicides, are formed on the source/drain regions at the same time as the polycide structure. This approach is referred to as a salicide process.

Also shown adjacent to this n-well resistor 301 is an NMOS transistor device 313. N-type transistor 313 comprises an n+ polysilicon control gate 312 formed on a gate dielectric which is formed on p-type silicon region 320. The p-type silicon region 320 of this sample embodiment is a p-well. A pair of n+ source/drain regions 318, 311 are formed laterally opposite sidewalls of polysilicon gate 312. N-type tip regions extend out from the source/drain regions and underneath the polysilicon gate 312. NMOS device 313 also includes a pair of spacers formed along laterally opposite sidewall of the polysilicon/dielectric stack. Also formed on the source/drain regions 318, 311, and the poly gate 312 is silicide 315, 317, 318. Shallow trench isolation (STI) regions bounds the drain 303 of the n-well resistor 301 and the source 318 of the NMOS device 313.

The n-well resistor 301 and NMOS transistor 313 are coupled together as in the similar devices in FIG. 2. The first terminal or drain 303 of the n-well resistor 301 is connected to the buffer output 214. The source 309 or second terminal of the resistor 301 is coupled to the drain terminal 315 of the NMOS device 313. NMOS transistor 313 has its gate terminal 317 connected to a control signal such as N_DRIVE 206 and its source terminal 319 coupled to a ground potential 220. The gate terminal 305 of the n-well resistor 301 in this embodiment is connected to the drain terminal 303, which is also the output 214 in this example.

The conductivity of the n-well resistor 301 can be modulated as a function of the gate bias. The gate 308 of this embodiment is coupled to the drain terminal 303 (also the output 214 of the buffer 212). The gate 308 to drain 303 short makes sure that high voltages at the output node 214 (drain 303) do not create any potential difference across the gate oxide since the gate and drain are shorted. This can prevent oxide break down. Hence the control gate should always be at the same voltage potential as the output node 214. High voltage should not be present between the gate 308 and drain 303. This lessens the possibility that the gate oxide under the control gate 308 would be damaged during a ESD event since the poly 308 and output node 214 are connected.

Although the n-well resistor in accordance with the present invention is described in conjunction with an output buffer circuit and with an NMOS transistor device, alternative embodiments of an n-well resistor device and its method of fabrication can be used with any other circuits. Embodiments of the present invention can offer better controllability of the resistance as well as lower resistance per area.

Advances in silicon process technology have lead to the development of increasingly smaller device sizes for transistors in integrated circuits. In turn, the decreasing size of transistors has made the circuits increasingly susceptible to damage from ESD events. It is well known that ESD can irreparably damage an IC. The use of silicides in semiconductor manufacturing has increased the likelihood of a high electrostatic discharge resulting in voltage which causes damage to one of the output transistors connected to the input or output pins of an IC. The ESD problem is further aggravated by a move toward lower voltage levels by the industry. Some recent integrated circuits have been designed to operate with relatively low voltage supplies, typically 1.5–5V. The damage occurs when a high potential is applied to an input or output buffer of the integrated circuit which may occur by a person simply touching a package pin which is in electrical contact with an input or output buffer of the integrated circuit.

In order to protect these circuits from damage, certain ESD protection schemes have been developed. Since ESD is imparted to integrated circuits during normal handling of the chips, and to the boards containing the integrated circuits chips, engineers design integrated circuits to be able to absorb as much electrostatic discharge as possible without damage. Included in the overall ESD protection scheme is the n-well resistor.

The present invention is a novel n-well resistor design that provides comparable impedance to that of current resistors while significantly increasing control of the n-well resistor device. This resistor design can be especially useful in integrated circuits manufactured with a semiconductor process where the smaller device dimensions can start to limit the resistance of the ESD n-well resistors. Furthermore, the resistor design of the present invention does not add any steps to a conventional CMOS manufacturing process. Embodiments of the n-well resistor of the present invention can be integrated into a conventional CMOS process without issues. The method of fabrication is an extension of a self-aligned process.

One embodiment of the present invention provides an n-well resistor to protect a salicided output pull-down device from silicide melt filamentation during ESD discharge. This embodiment of the resistor is formed with no additional mask layers. A resistor in accordance with one embodiment of the present invention can also provide a resistance that is independent of isolation. These resistors can include characteristics such as requiring small die area, providing better control of impedance, and less performance fluctuation over process technologies.

One embodiment of the present invention addresses the problem of reducing the impedance of an output driver while achieving acceptable ESD protection. An implementation of the present invention in an input/output (I/O) buffer can provide a low resistance protection device that allows for lower driver impedance and superior performance I/O for given area density.

In the prior art, an isolation structure (STI) is used to form an n-well resistor by blocking salicide formation. This STI structure consumes a portion of the n-well (so-called pinched well), which results in higher sheet resistance of the structure. Furthermore, as device dimensions get smaller with newer semiconductor process technologies, the size of conventional resistors have to be increased to compensate for changes in impedance.

An embodiment of an n-well resistor device of the present invention is formed by blocking n+ salicide with a polysilicon blocking structure. A polysilicide gate is used to mask the n-well resistor. This allows the full n-well to be used in the resistor. The present n-well structure acts like a depletion mode transistor and can provide higher conductivity under higher voltages.

The n-well resistor of the present invention can also lead to the production of a lower resistance device having the same resistor length and width. In one implementation, an n-well structure that is highly resistive (1K ohms/square) is used. Hence a smaller structure can achieve similar resistance to that of a prior art n-well resistor having a larger physical area.

According to one embodiment of the present invention, the n-well resistor is laid out alongside the drain of the output transistor. This provides a better two dimensional distribution of the current along the channel, allowing for better protection against snapback.

An n-well ballast resistor is necessary for NMOS device protection from ESD discharge in salicided output driver of one embodiment. Prior art produces this resistor using high resistivity pinched n-well region under isolation oxide. The present invention produces a ballast resistor in a lower resistivity n-well region under polycide. ESD protection is accomplished without excessive imposition of output impedance. Furthermore, the resistor value is independent of an isolation process.

A method of forming an n-well resistor device in an integrated circuit in accordance with embodiments of the present invention will be explained with respect to cross-sectional illustrations shown in FIGS. 4A–4J.

According to the present invention, a silicon substrate 400 is provided in which a resistor of the present invention is to be fabricated as shown in FIG. 4A. For one embodiment of the present invention, the substrate 400 includes a monocrystalline silicon substrate having a p-type epitaxial silicon film with a dopant density of between $5 \times 10^{14}$ to $5 \times 10^{15}$ atoms/cm$^3$ formed thereon. The starting substrate need not, however, be a silicon epitaxial film formed on a monocrystalline silicon substrate and can be other types of substrates. For the purpose of the present invention, a substrate 400 is defined as the starting material on which devices of the present invention are fabricated.

First, isolation regions are formed in the substrate 400. In order to fabricate high density integrated circuits, the isolation regions are preferably shallow trench isolation (STI) regions. An STI can be fabricated by thermally growing a pad oxide layer of about 400 Å onto the surface of substrate 400 and then forming a silicon nitride layer having a thickness of approximately 1500 Å onto the pad oxide layer.

A photoresist mask is then formed using well known masking, exposing, and developing techniques over the nitride layer to define locations where isolation regions are desired. Isolation regions can be used to isolate active regions. Well known etching techniques are used to remove the silicon layer and pad oxide layer from locations from locations where isolation regions are desired. The nitride layer can be plasma etched using a chemistry comprising sulfur hexaflouride (SF$_6$) and Helium (He). The pad oxide layer can be plasma etched with carbon hexaflouride (C$_2$F$_6$) and helium (He).

The silicon substrate 400 is etched to form trenches where isolation regions are desired. The silicon trench etching step of the present invention forms a trench with tapered sidewalls. Sidewalls are formed with a slope of 60° to 80° from horizontal (i.e., from the silicon substrate surface) and preferably 65° from horizontal. Tapered sidewalls can be formed by plasma etching with chlorine (CL$_2$) and helium (He). For one embodiment of the present invention, trenches are formed to a depth between 3000 to 4000 Å into silicon substrate 400.

Next, the photoresist mask is removed and a thin, approximately 300 to 400 Å thermal oxide is grown over the sidewalls of the trenches. Thermal oxide can be grown by heating substrate 400 to a temperature between 900 to 1000° C. while exposing the substrate to an oxidizing ambient such as but not limited to O$_2$. The thermal oxide is then etched away using a wet etchant such as hydroflouric acid (HF). A second thermal oxide having a thickness between 300 to 600 Å is grown on the silicon sidewalls of the trenches. This second thermal oxide of one embodiment of the present invention is grown with a two step oxidation process. A first oxidation occurs in a dry ambient, such as O$_2$, followed by a second oxidation occurring in a wet ambient (i.e., in an ambient including water (H$_2$O)). The oxide growth/etch/oxide growth process of the present invention rounds the silicon corners of the trenches. Corner rounding improves the performance of the CMOS devices on the integrated circuit.

In an alternative method for rounding trench corners, one can first expose the trenches to an HF dip to remove a portion of the pad oxide beneath the silicon nitride film and then grow oxide film to round the corners. The desired trench oxide can then be etched way and followed by the formation of the second thermal oxide.

A trench fill material such as silicon oxide is then blanket deposited by chemical vapor deposition (CVD) over the silicon nitride layer and the thermal oxide layer in the trenches. The dielectric fill material is then polished back by chemical mechanical polishing until the top surface of the isolation region is substantially planar with the top surface of the silicon nitride layer and all oxide removed from the top of the silicon nitride. The silicon nitride layer and the pad oxide layer are then removed with well known techniques to form shallow, compact, and planar isolation regions.

Next, n-type and p-type well implants are made. For one of the present invention, the integrated circuit uses CMOS circuitry (i.e. NMOS and PMOS transistors). First, the p-type implants are made. A photoresist mask is formed over the portions of the logic area which are to be fabricated into n-type devices. The p-well implant forms p-wells 442 between shallow trench isolation regions in the logic portion of the integrated circuit to form channel regions for the NMOS devices. The p-well regions extend deep into substrate 400. P-wells 442 can be formed by well known ion implantation techniques using boron (B$^{11}$) at an energy of between 300 to 500 KeV and a dose of between $5 \times 10^{12}$ to $2 \times 10^{13}$ atoms/cm$^2$.

The photoresist mask is then removed with well known techniques and a second photoresist mask is formed over is formed over the portions of substrate to define the locations where n-well implants are to be made. The n-well photoresist mask can be used to prevent doping of the NMOS regions in the logic area. N-type dopants such as phosphorus or arsenic can be ion implanted at a dosage between $3 \times 10^{12}$ to $8 \times 10^{12}$ atom/cm$^2$ and at an energy between 400 to 800 KeV to form n-type wells 422 in substrate 400 to act as the channel regions for the PMOS devices in the logic circuitry. The n-well regions extend deep into substrate 400. The resistor device of the present invention will later be formed in one of these n-well regions.

The n-well photoresist mask is removed and substrate 400 heated to drive the n-type 422 and p-type wells 442 to the desired depth. A sacrificial oxide layer having a thickness of between 300 to 400 Å is grown over substrate 400 during the drive step. The sacrificial oxide layer is then stripped off by well known techniques, such as an HF dip. Referring now to FIG. 4B, an illustration of a cross-sectional view shows the formation of an n-well region 422 and a p-well region 442 in the substrate 400 of FIG. 4A. Boron ions can be implanted at this time, if desired, in order to adjust the threshold voltage of the NMOS devices, and arsenic and phosphorus can be implanted into PMOS devices to adjust their threshold voltages.

Figure 4C:
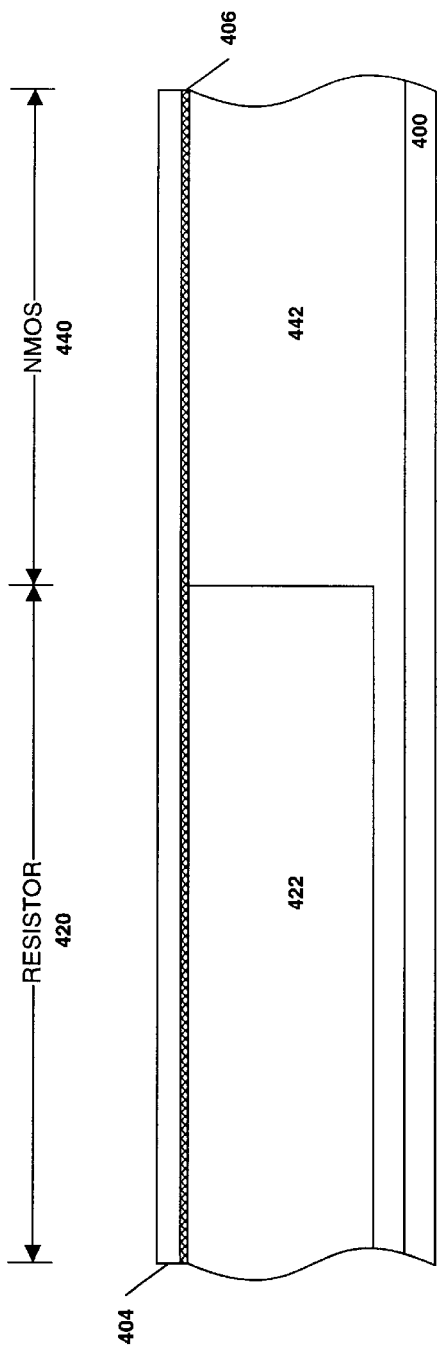
FIG. 4C is an illustration of a cross-sectional view showing the formation of a dielectric layer and a polysilicon layer on the substrate of FIG. 4B.

Next, as shown in FIG. 4C, a gate dielectric layer 406 is grown on the silicon substrate 400. A polysilicon layer 404 is then blanket deposited over substrate 400. The polysilicon layer 404 is formed over the gate oxide layer 406. For one embodiment of the present invention, the polysilicon layer 404 is deposited to a thickness between 3000 to 5000 Å. Polysilicon film 404 can be formed by any well known techniques such as by chemical vapor deposition and can be insitu doped or subsequently doped by ion implantation if desired. The polysilicon film 404 of one embodiment of the present invention remains undoped at this time and is subsequently doped by the CMOS source/drain implant. FIG. 4C is an illustration of a cross-sectional view showing the formation of a dielectric layer 406 and a polysilicon layer 404 on the substrate of FIG. 4B.

Polysilicon layer 404 is planarized with a chemical/mechanical polishing in order to form a planar top surface. The planar surface of polysilicon layer 404 enables improved lithography for the subsequent patterning or delineation of polysilicon layer 404. Polishing of polysilicon layer 404 is crucial for enabling good critical dimension (CD) control during subsequent patterning of polysilicon layer 404.

Figure 4D:
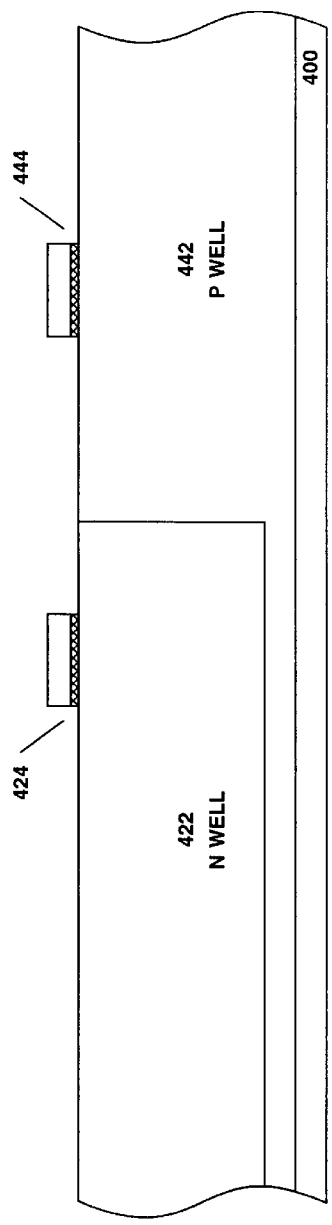
FIG. 4D is an illustration of a cross-sectional view showing the patterning of the dielectric layer and the polysilicon layer on the substrate of FIG. 4C.

A photoresist mask is formed over substrate 400 and patterned. The exposed portions of polysilicon film 404 and gate dielectric 406 are anisotropically etched in alignment with photoresist mask in order to form a plurality of discrete control gates. Polysilicon layer 404 can be anisotropically etched using a plasma etch comprising the chemistry of HBr, chlorine ($Cl_2$) and helium (He). As shown in FIG. 4D, the masking and etching steps form a plurality of gate dielectric 406/poly 404 stacks 424, 444, on the substrate 400. The photoresist layer is removed.

For this embodiment, shallow tip implants are included in the devices. For alternative embodiments, tip implants can be optional.

Another photoresist mask is formed over substrate 400. This n-well photoresist mask is formed over the PMOS portions of the substrate 400. The photoresist is patterned to expose the regions where n-well resistors and NMOS devices will be formed. Other regions including those that will have PMOS devices are covered by the mask so that no doping occurs there. N-type tip regions 426, 446, can now be formed in portions of the substrate for the NMOS devices and n-well resistors. N-type dopants 411 are implanted into the substrate portions of the NMOS devices and the n-well resistors. For this embodiment, the n-type tip regions are doped with arsenic (As). The arsenic can be implanted at a dosage between $5\times10^{14}$ to $5\times10^{15}$ atom/cm$^2$ at an energy between 2 to 10 KeV to form the shallow tip implants. FIG. 4E is an illustration of a cross-sectional view showing the doping of the polysilicon layer and the formation of n-type tip implants in the n-well resistor and NMOS portions of the substrate 400. Because the oxide/poly stacks 424, 444, of the NMOS devices and the resistor are not masked, the implants 411 also dope the polysilicon layer 404. Next, the photoresist layer is removed.

At this time, p-type tip implants for the PMOS devices in the logic portion of the circuitry can be made. Another photoresist mask is formed over substrate 400. This photoresist is patterned to expose the regions where PMOS devices will be formed. Other regions including those that will have n-well resistors and NMOS devices are covered by this mask so that no doping occurs there. P-type tip regions can now be formed in portions of the substrate to for the PMOS devices. P-type dopants are implanted into the substrate portions of the PMOS devices. For this embodiment, the p-type tip regions are doped with boron (B). The boron can be implanted at a dosage between $1\times10^{14}$ to $1\times10^{15}$ atom/cm$^2$ at an energy between 0.2 to 0.8 KeV to form the shallow tip implants. Because the oxide/poly stacks of the PMOS devices are not masked, the implants also dope the polysilicon layer. The photoresist layer is then removed.

A thin thermal oxide is grown over the exposed portions of silicon substrate 400 (e.g., source/drain regions and dielectric/poly stacks 424, 444). Next, a thin low temperature oxide liner 412 of approximately 200 Å is blanket deposited by CVD over the thermal oxide. The low temperature oxide acts as an etch stop for a subsequent silicon nitride spacer etch step. FIG. 4F is an illustration of a cross-sectional view showing the formation of a thermal oxide and a high temperature oxide 412 over the substrate 400.

Next, a silicon nitride film 414 is blanket deposited over substrate 400 as shown in FIG. 4G. FIG. 4G is an illustration of a cross-sectional view showing the formation of a silicon nitride layer 414 over the substrate 400. Silicon nitride film 414 is used to form spacers. The deposition thickness of the silicon nitride film 414 dictates the width of the subsequently formed spacers. For one embodiment of the present invention, silicon nitride film 414 is deposited to a thickness of between 1200 to 2500 Å. Any well known technique which can be used to deposit a conformal silicon nitride layer 414, such as chemical vapor deposition using source gases comprising ammonia $NH_3$ and silane $SiH_4$ can be used to deposit silicon nitride film 414.

The silicon nitride film 414 is anisotropically etched to form a plurality of spacers 430, 450, which run along laterally opposite sidewalls of each patterned oxide/poly stack 424, 444, of the integrated circuit. Deposited oxide layer 412 acts as an etch stop for the anisotropic silicon nitride etch step. Any anisotropic etching technique that preferentially etches silicon nitride as compared to silicon dioxide can be used. One technique is plasma etching using the chemistry comprising sulfur hexaflouride ($SF_6$) and helium (He).

An etch step is used to remove the oxide films 412 from the active regions not protected by the nitride spacers 430, 450, and from the top of the polysilicon layer. A plasma etch using a chemistry comprising carbon hexaflouride ($C_2F_6$) and helium (He) can be used to remove oxide films 412. FIG. 4H is an illustration of a cross-sectional view showing the formation of spacers 430, 450, from the silicon nitride layer 414 on the substrate 400.

At this time a p+ source/drain implant mask is formed and patterned over the substrate 400. The mask covers the n-well resistor and NMOS portions of the integrated circuit. The PMOS portions of the integrated circuit are left exposed. Then heavy p+ source/drain implants are made to the exposed PMOS devices. For this embodiment, the p+ source/drain regions are doped with boron (B). The boron can be implanted at a dosage between $5\times10^{14}$ to $5\times10^{15}$ atom/cm$^2$ at an energy between 3 to 8 KeV to form the heavy p+ source/drain regions. The implant mask is then removed.

Figure 4I:
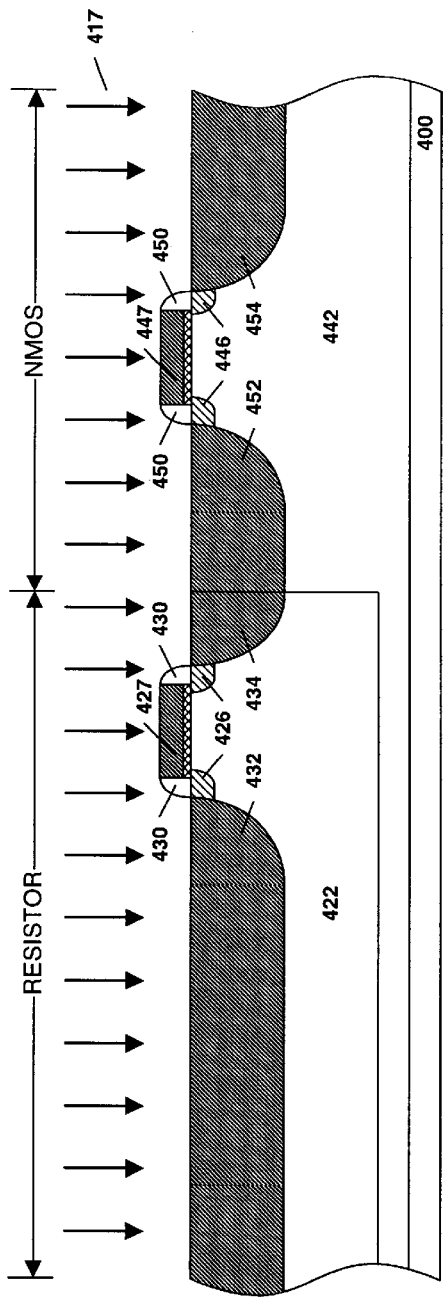
FIG. 4I is an illustration of a cross-sectional view showing the doping of the polysilicon layer and the formation of deep implants in the n-type source/drain regions of the n-well resistor and NMOS portions of substrate of FIG. 4H.

Similarly, a n+ source/drain implant mask is formed and patterned over the substrate 400. This mask covers the PMOS portions of the integrated circuit. The source/drain regions of the n-well resistors and the NMOS portions of the integrated circuit are exposed. Then heavy n+ source/drain implants 417 are made to the exposed NMOS devices and resistors. For this embodiment, the n+ source/drain regions are doped with arsenic (As). The arsenic can be implanted at a dosage between $5\times10^{15}$ to $5\times10^{16}$ atom/cm$^2$ at an energy between $^{10}$ to 60 KeV to form the heavy n+ source/drain regions. FIG. 4I is an illustration of a cross-sectional view showing the doping of the polysilicon layer 427, 447, and the formation of deep implants in the n+ source/drain regions of the n-well resistor 420 and NMOS 440 portions of the substrate 400. The implant mask is then removed.

A refractory metal film is blanket deposited over substrate 400. Any metal film which can react with silicon to form a low resistance metal silicide when heated to a suitable temperature can be used. Prior to metal film deposition, a short HF dip can be used to remove any native oxides. For one embodiment of the present invention, the metal film is titanium deposited to a thickness between 200 to 500 Å. Any well known technique such as, but not limited to, sputtering can be used to blanket deposit metal film. If desired, silicon atoms (Si$^{28}$) can be implanted into the metal film at a dose of between $2\times10^5$ to $4\times10^5$ atoms/cm$^2$ and at an energy between 20 to 30 KeV.

Substrate 400 is then heated to a temperature sufficient to cause the metal film to react with silicon to form a metal silicide. Metal silicide forms on those locations where silicon is available for reaction with the metal and is in direct contact with the metal. For one embodiment, metal silicide 436, 437, 438, 456, 457, 458, forms on the top of the polysilicon control gates 427, 447, on the source/drain regions 432, 434, 452, 454, of the devices and on polysilicon interconnects. Metal film remains unreacted over areas where there is no silicon available for reaction. Such areas include dielectric layer 406, sidewall spacers 430, 450, and shallow trench isolation regions. The silicide formed in one embodiment is a low resistance titanium silicide (TixSiy), preferably in the C-54 phase. Any suitable heating or annealing process can be used to form metal silicide including a furnace anneal or a rapid thermal anneal.

Figure 4J:
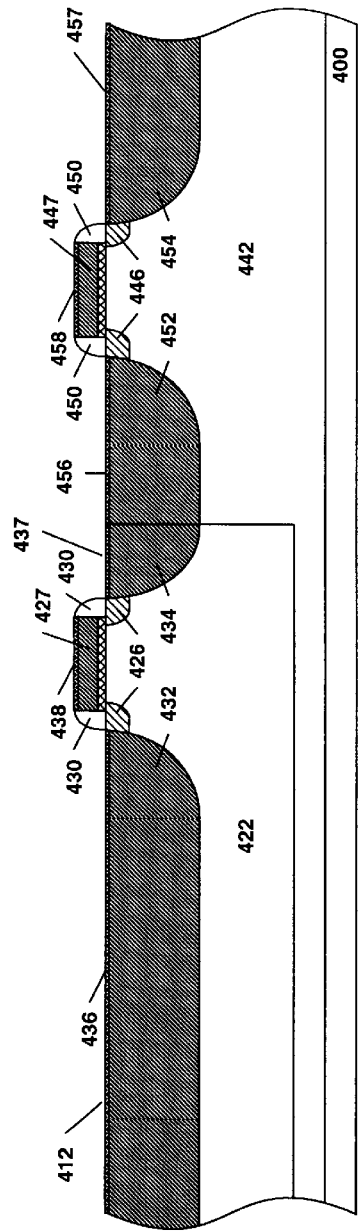
FIG. 4J is an illustration of a cross-sectional view showing the formation of a silicide on the substrate of FIG. 4I.

Unreacted metal is etched away with an etchant which selectively removes the unreacted metal, but does not remove the formed metal silicide. A wet etchant comprising H$_2$O$_2$/NH$_4$OH/H$_2$O can be used to selectively remove the titanium metal without etching the titanium silicide. FIG. 4J is an illustration of a cross-sectional view showing the formation of a silicide on the substrate 400.

An interlayer dielectric (ILD) is then blanket deposited over substrate 400. Interlayer dielectric can be any suitable dielectric such as silicon dioxide and can be a composite dielectric comprising a plurality of different deposited dielectrics. The interlayer dielectric is planarized by a chemical/mechanical polishing to for a planar top surface. The ILD layer should be deposited to a sufficient thickness that will enable a certain amount of dielectric to be removed such that a sufficiently planar top surface can be achieved. The ILD layer should be thick enough so that a sufficient amount, for example between 3500 to 4500 Å, of interdielectric is left above the highest features to sufficiently isolate the features from a subsequently formed metal line on top of the planar surface.

Electrical contacts are then formed through the ILD to the source/drain regions and the gates of the n-well resistors and the PMOS and NMOS devices. All contacts are made to low resistance silicide regions in one embodiment. Contacts can be formed by any well known techniques. In one embodiment, contacts are formed by forming a photoresist mask over the ILD to define locations where contacts are desired. Via holes are then etched though the ILD down to the silicide regions. An etchant which preferentially etches ILD but which does not etch silicide is preferably used. The mask is then removed and a barrier layer such as, but not limited to, titanium/titanium nitride is blanket deposited over the ILD and into the via openings. Next, a tungsten film can be blanket deposited by chemical vapor deposition over the barrier layer and into the formed via openings. The tungsten film is formed to a thickness which completely fills the via openings. The tungsten film and the barrier layers can then be chemically/mechanically polished back to remove the films from the top surface of the ILD and thereby forming Ti/TiN/W contacts.

A first level of metallization (metal 1), such as aluminum, is blanket deposited by any well known technique such as sputtering over the planar ILD surface. The metal film may or may not include a barrier layer such as titanium and/or a capping layer such as titanium/titanium nitride if desired. The metal film is then patterned using well known photolithography and etching techniques.

The back end processing techniques of forming ILD and metal layers can be continued to add as many levels of metallization as desired to interconnect the various devices and n-wall resistors fabricated on substrate 400. After the last level of metallization is formed and patterned, well known passivation films are formed in order to hermetically seal the integrated circuit. At this point, the fabrication of an integrated circuit including n-well resistors in accordance with the present invention is complete.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A resistor comprising:

a first n-type region and a second n-type region formed in an n-type silicon region, wherein said n-type silicon region is an n-well;

a gate dielectric layer formed on said n-type silicon region; and a polysilicon gate formed on said gate dielectric layer, wherein conductivity of said resistor is modulated as a function of gate bias on said polysilicon gate.

2. The resistor of claim 1 wherein said first n-type region is a first terminal of said resistor and said second n-type region is a second terminal of said resistor.

3. The resistor of claim 1 further comprising silicide formed on said first n-type region, said second-n-type region, and said polysilicon gate.

4. The resistor of claim 1 wherein said polysilicon gate is doped n-type.

5. The resistor of claim 1 wherein said polysilicon gate is coupled to said first n-type region.

6. The resistor of claim 1 further comprising a pair of spacers.

7. The resistor of claim 1 wherein said first n-type region and said second n-type region are doped n+ type.

8. The resistor of claim 1 wherein said second n-type region is coupled to a transistor.

9. The resistor of claim 1 wherein said n-well is doped with an n-type dopant, said dopant ion implanted at a dosage between $3\times10^{12}$ to $8\times10^{12}$ atom/cm$^2$.

10. The resistor of claim 9 wherein said n-type dopant is phosphorus.

11. The resistor of claim 9 wherein said n-type dopant is arsenic.

12. The resistor of claim 9 wherein said first n-type region and said second n-type region are doped with arsenic.

13. The resistor of claim 12 wherein said arsenic is implanted at a dosage between $5\times10^{15}$ to $5\times10^{16}$ atom/cm$^2$.

14. An n-well resistor device formed on a substrate comprising:

an n-type source region formed in an n-well region;

an n-type drain region formed in said n-well region;

a dielectric layer formed on said n-type silicon region between said source and drain regions;

a polysilicon gate formed on said dielectric layer, wherein biasing of said polysilicon gate modulates conductivity of said n-well resistor; and a pair of spacers formed laterally on opposite sides of said polysilicon gate.

15. The resistor of claim 14 wherein said source and drain regions are doped n+ type.

16. The resistor of claim 14 wherein said n-type source region is coupled to an n-type transistor device.

17. The resistor of claim 14 wherein said polysilicon gate controls resistance.

18. The resistor of claim 14 wherein said polysilicon gate is coupled to said n-type drain region.

19. The resistor of claim 14 wherein said polysilicon gate is doped n-type.

* * * * *

UNITED STATES PATENT AND TRADEMARK OFFICE
CERTIFICATE OF CORRECTION

PATENT NO. : 6,531,745 B1
DATED : March 11, 2003
INVENTOR(S) : Woolery et al.

It is certified that error appears in the above-identified patent and that said Letters Patent is hereby corrected as shown below:

Column 8,
Line 12, delete "Comer", insert -- Corner --.

Column 12,
Line 26, delete "n-wall", insert -- n-well --.

Signed and Sealed this

Tenth Day of June, 2003

JAMES E. ROGAN
*Director of the United States Patent and Trademark Office*